US008085592B2

(12) United States Patent
Yun et al.

(10) Patent No.: US 8,085,592 B2
(45) Date of Patent: Dec. 27, 2011

(54) CHARGE-TRAP FLASH MEMORY DEVICE WITH REDUCED ERASURE STRESS AND RELATED PROGRAMMING AND ERASING METHODS THEREOF

(75) Inventors: Sung-Won Yun, Gyeonggi-do (KR); Seung-Hyun Moon, Seoul (KR); Jong-Sun Sel, Daegu (KR); Yoo-Cheol Shin, Gyeonggi-do (KR); Ki-Hwan Choi, Gyeonggi-do (KR); Jae-Sung Sim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 321 days.

(21) Appl. No.: 12/356,123

(22) Filed: Jan. 20, 2009

(65) Prior Publication Data

US 2009/0185421 A1 Jul. 23, 2009

(30) Foreign Application Priority Data

Jan. 21, 2008 (KR) ............................ 2008-0006216

(51) Int. Cl.
*G11C 11/34* (2006.01)

(52) U.S. Cl. ........... 365/185.09; 365/185.2; 365/185.11; 365/185.17; 365/185.18; 365/200

(58) Field of Classification Search ............... 365/185.2, 365/185.09, 185.24, 185.29, 200, 185.11, 365/185.17, 185.18
See application file for complete search history.

(56) References Cited

U.S. PATENT DOCUMENTS

| | | | | |
|---|---|---|---|---|
| 6,388,925 | B1 * | 5/2002 | Kim | 365/200 |
| 6,771,541 | B1 * | 8/2004 | Park | 365/185.22 |
| 7,212,437 | B2 * | 5/2007 | Atti et al | 365/185.05 |
| 2006/0133155 | A1 * | 6/2006 | Fujita et al. | 365/185.29 |
| 2007/0025167 | A1 * | 2/2007 | Ziegelmayer et al. | 365/201 |

FOREIGN PATENT DOCUMENTS

| | | |
|---|---|---|
| JP | 2006-164408 | 6/2006 |
| KR | 1020000044941 | 7/2000 |
| KR | 10-0293633 | 4/2001 |
| KR | 1020010061460 | 7/2001 |

* cited by examiner

*Primary Examiner* — Pho M Luu
*Assistant Examiner* — Thao Bui
(74) *Attorney, Agent, or Firm* — Myers Bigel Sibley & Sajovec, P.A.

(57) ABSTRACT

Operation methods of charge-trap flash memory devices having an unused memory cell for data storage and a normal memory cell used for data storage are discussed. The operation method may include selecting the unused memory cell, and programming the unused memory cell to have a predetermined threshold voltage. The charge-trap flash memory device may thus be provided with improved reliability by interrupting erasure stress to unused memory cells.

5 Claims, 8 Drawing Sheets

CHARGE-TRAP FLASH MEMORY DEVICE WITH REDUCED ERASURE STRESS AND RELATED PROGRAMMING AND ERASING METHODS THEREOF

RELATED APPLICATION

This U.S. non-provisional patent application claims priority under 35 U.S.C. §119 of Korean Patent Application No. 10-2008-0006216 filed on Jan. 21, 2008, the entire disclosure of which is hereby incorporated herein by reference.

BACKGROUND

The present invention disclosed herein relates to semiconductor memory devices, and more particularly, to nonvolatile memory devices and related methods.

Semiconductor memories are widely used as fundamental microelectronic components in applications with digital logic circuits such as computers and in systems using microprocessors ranging from satellites to customer electronics. Improved performance may be provided by improving processing techniques to allow that scaling-down for high integration density and high frequency operation.

Semiconductor memory devices may be classified as volatile and nonvolatile memory devices. In volatile semiconductor memory devices, logical information is stored by setting a logical condition of a bistable flipflop loop (as in a static random access memory) or by capacitive charging (as in a dynamic random access memory). A volatile semiconductor memory may store and read data when power is available, but may lose data when power is cut off.

A nonvolatile semiconductor memory devices may be able to maintain data stored therein even when power is cut off or suspended. A storage condition in a nonvolatile memory device may be designed to be immutable or re-programmable in accordance with fabrication techniques. A nonvolatile semiconductor memory device may be effectively used to store program files and/or micro-codes widely over applications such as computers, aerospace electronic engineering, communications, and customer electronics. As a special case, nonvolatile RAMs (nvRAMs) may be employable in systems requiring frequent and fast combinations between storage modes of volatile and nonvolatile conditions and being in need of re-programmable nonvolatile memories. In addition, nonvolatile RAMs are being studied for applications with specific memory architectures that include additional logic circuits to improve functions for application-oriented works.

Among nonvolatile semiconductor memories, MROM, PROM, and EPROM may be inconvenient to renew storage contents by general users because they are designed not to easily erase and write data therein. An EEPROM may be electrically erased and programmable with data, so it may be used for systemic programming operations that continuously require updating of data, or for auxiliary storage units.

Flash memory devices are nonvolatile memories that are electrically erasable and programmable read-only memories (EEPROMs) in which plural memory blocks are erased or written with data by one operation of programming. An EEPROM is operable such that all memory cells of one memory block are erasable or programmable at the same time. A flash memory may operate more rapidly and effectively in reading and writing data when systems employing such flash memory devices read and write data from and into other memory areas at the same time. All kinds of flash memories or EEPROMs may be configured such that insulation films enclosing charge storage elements used for storing data may be worn out after a specific number of operations.

A flash memory may store information even without power. A flash memory may be able to retain information/data stored therein without power consumption even after interruption of a power supply to the chip. In addition, flash memories offer resistance to physical shocks and fast access times for reading. Flash memories may thus be widely used as storage units in electronic apparatuses powered by batteries.

In a generic flash memory device, bit information is stored by injecting charges into a conductive floating gate, which is isolated through an insulation film, by the Fowler-Nordheim (F-N) tunneling mechanism. However, such a conductive floating gate may have a physical limit in integration, causing capacitive couplings between memory cells or between memory cells and selection transistors (i.e., string and ground selection transistors). For the purpose of reducing capacitive couplings between conductive floating gates of cell and selection transistors, charge-trap flash memory devices may be used. A charge-trap flash memory device may use an insulation (or dielectric) film, which is made of $Si_3N_4$, $Al_2O_3$, HfAlO, or HfSiO, as a charge storage layer.

However, there may still be physical problems in a charge-trap flash memory device. A typical problem arising from the charge-trap flash memory device may be 'erase stress', 'erasing stress', or 'erasure stress' (hereinafter called 'erasure stress') that is caused while repeatedly erasing a specific memory cell without programming. In an erasing operation, the ground voltage is applied to a word line of memory cells and an erasing voltage is applied to a bulk (e.g., pocket P-well) of the memory cells, while string and ground selection transistors float. At a memory cell under this bias condition, an electric field is formed toward a control gate from the pocket P-well, resulting in hole injection to a charge storage layer of the memory cell from the pocket P-well. Then, trapped electrons are consumed by electron-hole pairs (EHPs) with the injected holes in the charge storage layer (i.e., charge trap layer). If the memory cell is repeatedly erased, more holes are injected into the charge trap layer. That is, in a charge-trap cell transistor used as a memory cell, an injection amount of holes is raised in proportion to the times of erasing cycles. An excessive increase of hole injection amount would cause inadvertent EHPs with electrons held at trap layers of adjacent memory cells. This effect means there would be variation of threshold voltages in adjacent charge-trap flash transistors. Therefore, it may be necessary for the charge-trap flash memory device to be confined in erasing cycle times, not to be continuously left on the erasing operation.

SUMMARY

Some embodiments of the present invention are directed to charge-trap flash memory devices capable of reducing erasure stress, and related programming and/or erasing methods.

According to some embodiments of the present invention, a method of operating a charge-trap flash memory device having an unused memory cell for data storage and a normal memory cell used for data storage may include selecting the unused memory cell. The unused memory cell may be programmed to have a predetermined threshold voltage.

According to other embodiments of the present invention, a method of programming a charge-trap flash memory device having an unused memory cell for data storage and a normal memory cell used for data storage may be provided. Whether an input address is involved in an address of the unused memory cell may be determined. The unused memory cell may be compulsively programmed while programming a memory cell corresponding to the input address if the input address is involved in the address of the unused memory cell.

According to other embodiments of the present invention, a charge-trap flash memory device may include: a cell array with an unused memory cell and a row decoder connected to the cell array through a word line; a page buffer connected to the cell array through a bit line, and a column selector may select the page buffer. An unused address reservoir may store an address of the unused memory cell. A control logic circuit may control the row decoder, the page buffer, and the column selector to erase and program the cell array with reference to a command and input address provided from an external and an unused memory cell address provided from the unused address reservoir. The control logic circuit may set the unused memory cell to be programmed in a predetermined threshold voltage whenever the input address is found out as corresponding to the same block with the unused memory cell address.

According to still other embodiments of the present invention, a repairing method for a charge-trap flash memory device may include comparing an input column address with fuse data stored in a wrapping-repair fuse box. A bit line may be replaced with one of redundant bit lines in correspondence with the input column address if the input column address is identical to the fuse data. The fuse data may be set to replace a fail bit line and bit lines adjacent to the left and right of the fail bit line with the redundant bit lines.

According to yet other embodiments of the present invention, a charge-trap flash memory device may include a cell array connected to pluralities of main and redundant bit lines. A page buffer and column decoder may repair one of the main bit lines with one of the redundant bit lines in response to a wrapping-repair signal. A wrapping-repair fuse box may provide the wrapping-repair signal to repair a bit line adjacent to the left or right of a fail bit line of the main bit lines with one of the redundant bit line in response to a column address.

According to the aforementioned structure and programming/erasing methods, erasure stress of unused memory cells of adjacent memory cells of the charge-trap flash memory device due to repetitive exposure to the erasing operations may be reduced. Accordingly, reliability of operational characteristics may be improved.

DETAILED DESCRIPTION

Figure 1:
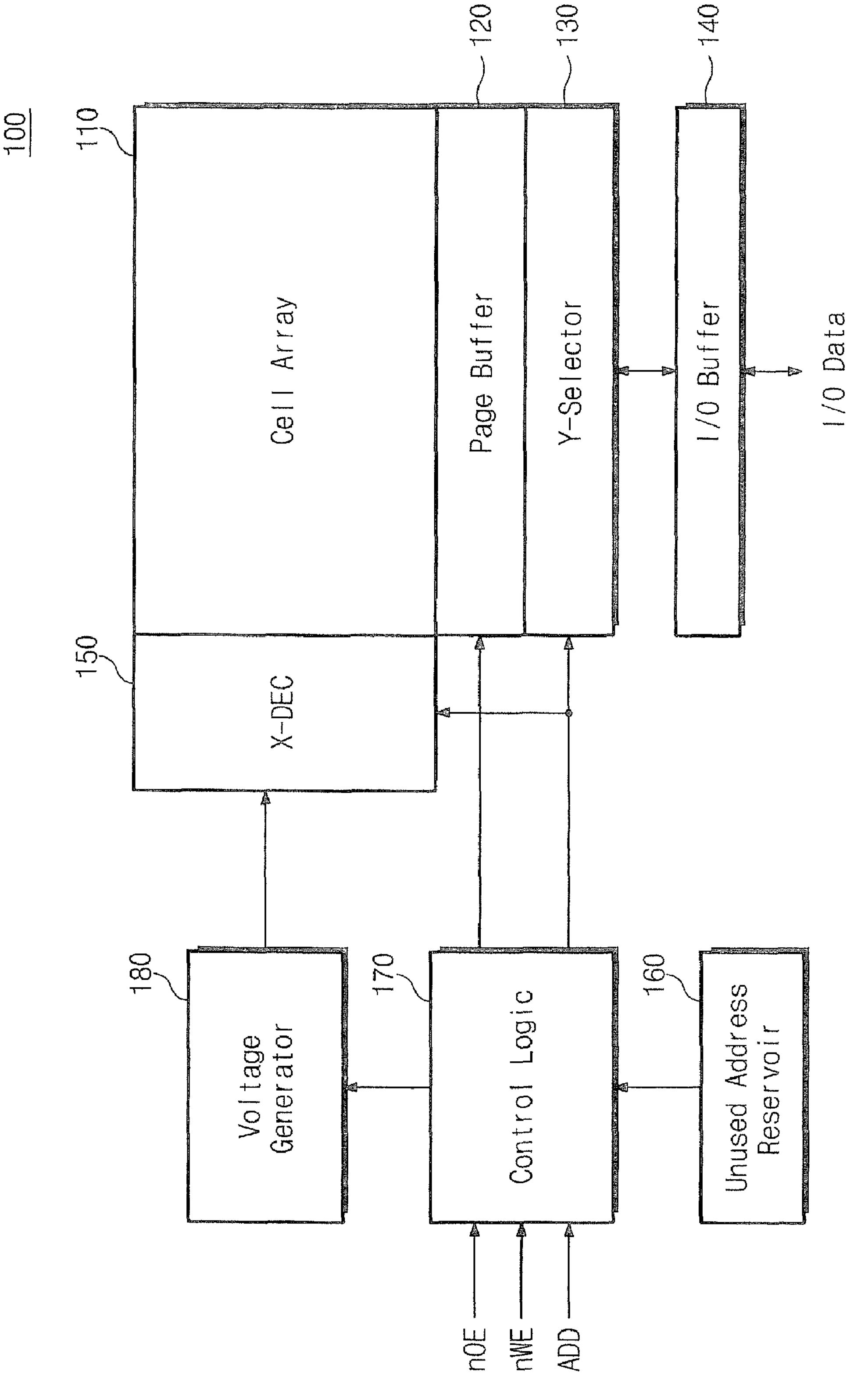
FIG. 1 is a block diagram of a charge-trap flash memory device according to embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes/dimensions and relative sizes/dimensions may be exaggerated for clarity. Like numbers refer to like elements throughout.

It will be understood that when an element or layer is referred to as being “connected to” or “coupled to” or “adjacent to” another element, it can be directly connected, coupled, or adjacent to the other element, or layer or intervening elements may be present. In contrast, when an element is referred to as being “directly connected to” or “directly coupled to” or “directly adjacent to” another element, there are no intervening elements present. As used herein, the term “and/or” includes any and all combinations of one or more of the associated listed items.

It will be understood that, although the terms first, second, third etc. may be used herein to describe various elements, components, and/or sections, these elements, components, and/or sections should not be limited by these terms. These terms are only used to distinguish one element, component, or section from another element, component, or section. Thus, a first element, component, or section discussed below could be termed a second element, component, or section without departing from the teachings of the present invention.

Spatially relative terms, such as “beneath”, “below”, “lower”, “above”, “upper”, “top”, “higher”, “left”, “right” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is rotated 90 degrees, elements described as to the “left” or “right” or other elements or features would then be oriented “above” or “below” the other elements or features. Thus, the exemplary terms “left” or “right” can encompass both an orientation of above and below. The device may be otherwise oriented (rotated 90 degrees or at other orientations) and the spatially relative descriptors used herein interpreted accordingly. The terminology used herein is for the purpose of describing particular embodiments only, and is not intended to be limiting of the present invention. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

FIG. 1 is a block diagram of a charge-trap flash memory device according to embodiments of the present invention. Referring to FIG. 1, the flash memory device 100 may include a cell array 110 including charge-trap transistors used to store N-bit data information (where N is 1 or an integer larger than 1). The cell array 110 may also include memory cells that are unused for data storage (hereinafter, referred to as 'unused memory cells'). The flash memory device 100 may further include a control logic circuit 170 and an unused address reservoir 160 used to manage erasure stress.

The cell array 110 may be formed of cell transistors having respective charge trap layers. A unit cell transistor may be able to store 1-bit data information or multi-bit data information. The cell array 110 may be divided into a main field used to store normal data and a spare field used to store data associated with the normal data. The main field stores M-bit data (where M is 2 or an integer larger than 2) while the spare field stores 1-bit data. The cell array 110 includes memory cells arranged along pluralities of rows (or word lines) and columns (or bit lines), being segmented into pluralities of memory blocks or sectors. Memory cells of each memory block may be configured in a logical form of a NOR or a NAND chain. Furthermore, the cell array 110 may also include memory cells unused for data storage (i.e., unused memory cells). Such unused memory cells may correspond to memory cells which are included in a column that is interrupted due to a defect, or redundant memory cells which are prepared for repair but not used to establish redundancy. These memory cells are not accessed during programming and/or reading operations. These memory cells will be referred to hereinafter as unused memory cells. Not storing any data, the unused memory cells are not accessed during programming operations. According to operation characteristics of flash memory devices, the unused memory cells may be repeatedly erased during block erasing cycles of erasing operations. The unused memory cells may thus be inadvertently subjected to erasure stress. According to embodiments of the present invention, the flash memory device 100 may reduce such erasure stress arising from the unused memory cells.

Page buffer 120 is controlled by control logic circuit 170, functioning as a sense amplifier or write driver in accordance with an operation mode. During a reading operation, page buffer 120 acts as a sense amplifier used to read data from the cell array 110. During a programming operation, the page buffer 120 acts as a write driver used to activate bit lines in accordance with data to be stored in the cell array 110. The page buffer 120 may include a plurality of page buffer circuits (not shown) corresponding to respective columns (or bit lines) or bit-line pairs.

A column selector (Y-selector) 130 is controlled by the control logic circuit 170, to provide data transmission paths between the page buffer 120 and an input/output buffer 140. During a reading operation, the column selector 130 transfers page-unit data (e.g., 2K+64 Bytes; hereinafter referred to as 'page data') into the input/output buffer 140 from the page buffer 120 in the unit of input/output (e.g., 1 or 2 Bytes). During a programming operation, under regulation by the control logic circuit 170, the column selector 130 provides input/output-unit data (hereinafter referred to as 'input/output data') from the input/output buffer 140 to the page buffer 120 in a unit of a page. The control logic circuit 170 controls the column selector 130 to turn a defective column to a redundant column in compliance with fuse information (not shown), enabling a repair operation.

A row decoder (X-DEC) 150 is controlled by the control logic circuit 170, operating to select one of the memory blocks of the cell array 110 and one of the word lines of a selected memory block. The row decoder 150 drives selected and unselected word lines using word line voltages supplied from a voltage generator 180 in accordance with an operation mode.

The unused address reservoir 160 stores addresses of unused memory cells. The unused address reservoir 160 also provides the addresses of unused memory cells to the control logic circuit 170. Usually, the unused memory cells may include memory cells connected to a failed column (or defective column). The unused memory cells also include redundant memory cells which are intentionally unused/reserved for repair. Further, dummy cells may be included in the unused memory cells. The dummy cells may be memory cells connected to a dummy bit line. The dummy cells may be memory cells belonging to a row or column that is inserted into the cell array 110 for a specific purpose, as well as those connected to a dummy bit line(s). The unused memory cells mentioned throughout this description are excluded from programming operations, which only include memory cells selected as targets to be erased. Addresses for the unused memory cells can be obtained after a test operation of a manufacturing process, and then stored in the unused address reservoir 160. The unused address reservoir 160 may include a fuse box. The unused address reservoir 160 may be configured in a nonvolatile memory like the cell array 110.

The control logic circuit 170 controls the page buffer 120, the column selector 130, the row decoder 150, and the voltage generator 180 to execute programming and/or reading operations for the cell array 110 in response to commands (e.g., nOE and new) and an address ADD which are provided from an external source (e.g., from a memory controller). According to first embodiments of the present invention, the control logic circuit 170 conducts a pre-programming operation for all memory cells of a memory block (including unused memory cells) before the erasing operation. After the pre-programming operation, the memory block is erased. According to second embodiments of the present invention, the control logic circuit 170 conducts a post-programming operation to program only the unused memory cells to a predetermined state of threshold voltages after the pre-programming operation. According to third embodiments of the present invention, the control logic circuit 170 enables the unused memory cells to be programmed into a predetermined state of threshold voltages. For example, in response to a program command, the control logic circuit 170 operates to program the unused memory cells which are located in the same page with memory cells to be programmed. These embodiments will be discussed in greater detail below in conjunction with the accompanying figures.

The voltage generator 180 operates to generate word line voltages (e.g., a program voltage, a read voltage, and a pass voltage) which are applied to the word lines in accordance with operation modes, in response to control logic circuit 170. The voltage generator 180 also outputs a well bias voltage that is applied to a bulk of the memory cells in a block (e.g., a pocket P-well) in which the memory cells are formed.

According to the aforementioned in conjunction with FIG. 1, memory devices according to embodiments of the present invention may be able to reduce repetitive erasure of unused memory cells in response to erasure and/or program commands. Thus, it may be possible to reduce erasure stress of unused memory cells.

Figure 2A:
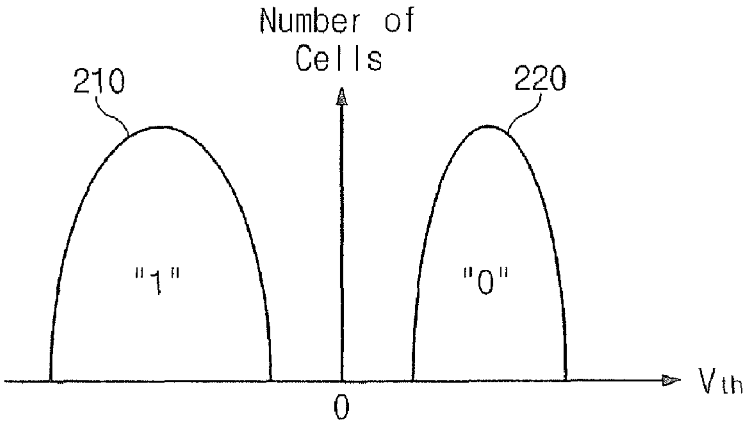
FIGS. 2A and 2B illustrate operations of programming unused memory cells according to embodiments of the present invention.
Figure 2B:
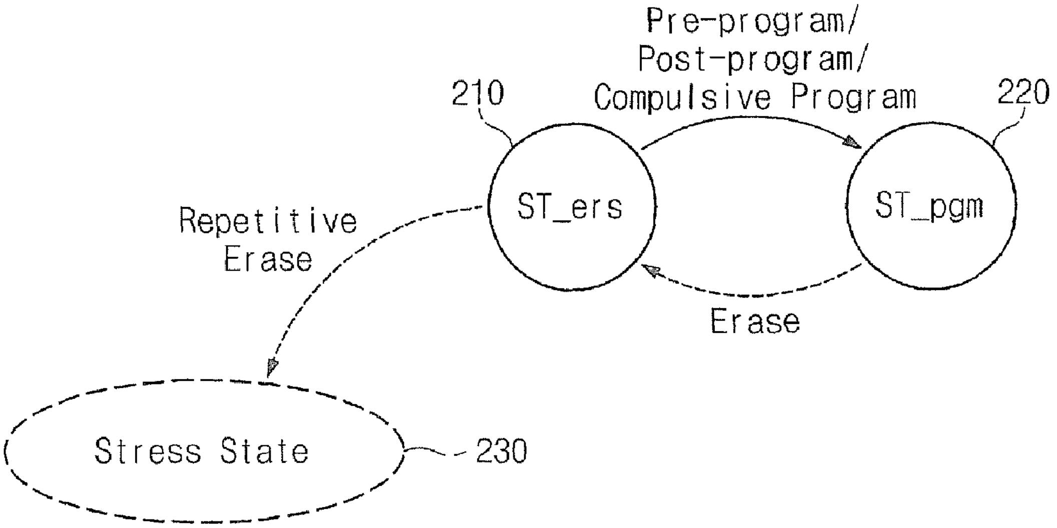

FIGS. 2A and 2B illustrate a feature of programming unused memory cells in accordance with embodiments of the present invention, showing a control scheme of flash memory devices according to first, second and third embodiments of the present invention noted above. FIG. 2A is a graphic diagram showing threshold voltage distributions of memory cells corresponding to programmed and erased states, and FIG. 2B is a state diagram showing transitions of threshold voltage levels.

Referring to FIG. 2A, memory cells of cell array 110 are conditioned in a threshold voltage distribution 210 corresponding to the erased state (hereinafter, referred to as 'erased threshold-voltage distribution') and a threshold voltage distribution 220 corresponding to the programmed state (hereinafter, referred to as 'programmed threshold-voltage distribution'). The erased threshold-voltage distribution 210 corresponds to memory cells having a relatively low density of electrons held in the charge trap layers of cell transistors. In other words, the erased threshold-voltage distribution 220 corresponds to the state that threshold voltages to turn cell transistors on is lower than 0V. The programmed threshold-voltage distribution 220 results from electric fields between the bulk and the control gates of cell transistors provided by applying a high voltage to the control gate of cell transistors. While applying this high voltage, electrons injected from channels due to F-N tunneling effect are captured by the charge trap layers, increasing the threshold voltages of programmed cell transistors. Thus, the threshold voltages of the programmed cell transistors are included in the programmed threshold-voltage distribution 220. In FIG. 2A, the programmed threshold-voltage distribution 220 is shown in a single state for simplicity of description. For a multi-bit flash memory device, threshold voltage distributions corresponding to programmed states may be provided in more than two separate programmed threshold-voltage distributions.

Referring to FIG. 2B, in the flash memory device 100 according to embodiments of the present invention, the unused memory cells may be exposed to repetitive erasing cycles. Here, a repetitive erasing means a state such that a block erasing operation continues under an erasing condition while the unused memory cells cannot be programmed because they do not store data. In other words, a flash memory device 100 according to embodiments of the present invention may operate to put the unused memory cells into the programmed threshold-voltage distribution (or programmed state) in response to a specific command (an erasure or program command). Thereby, in a flash memory device 100 according to embodiments of the present invention, effects of holes that are excessively injected into the charge trap layers of the unused memory cells may be reduced for charge trap layers of adjacent memory cells. In more detail, if the unused memory cells with threshold voltages conditioned in the erased threshold-voltage distribution (or erased state) 210 are repeatedly erased without being programmed, the threshold voltages of the unused memory cells may move to a stress state 230. Accordingly, charge trap layers of adjacent memory cells may be affected by such excessive hole injection. Thus, the unused memory cells may need to be compensated for (counteracted to) such an abnormal effect due to erasure stress arising from the charge trap layers, or interrupted from the repetitive erasing environment. For this function, in the flash memory device 100 according to embodiments of the present invention, the unused memory cells may be forced to be in the programmed state 220 under a specific condition. While the programmed state 220 is set on a specific data state (e.g., '0'), embodiments of the present invention may not restrictive hereto. In other words, the unused memory cells can be programmed to have threshold voltages higher than the threshold voltage of the erased state 210. This state transition may be generated while pre-programming before the erasing operation, while post-programming after the erasing operation, or while compulsively programming the unused memory cells in the programming operation.

Figure 3:
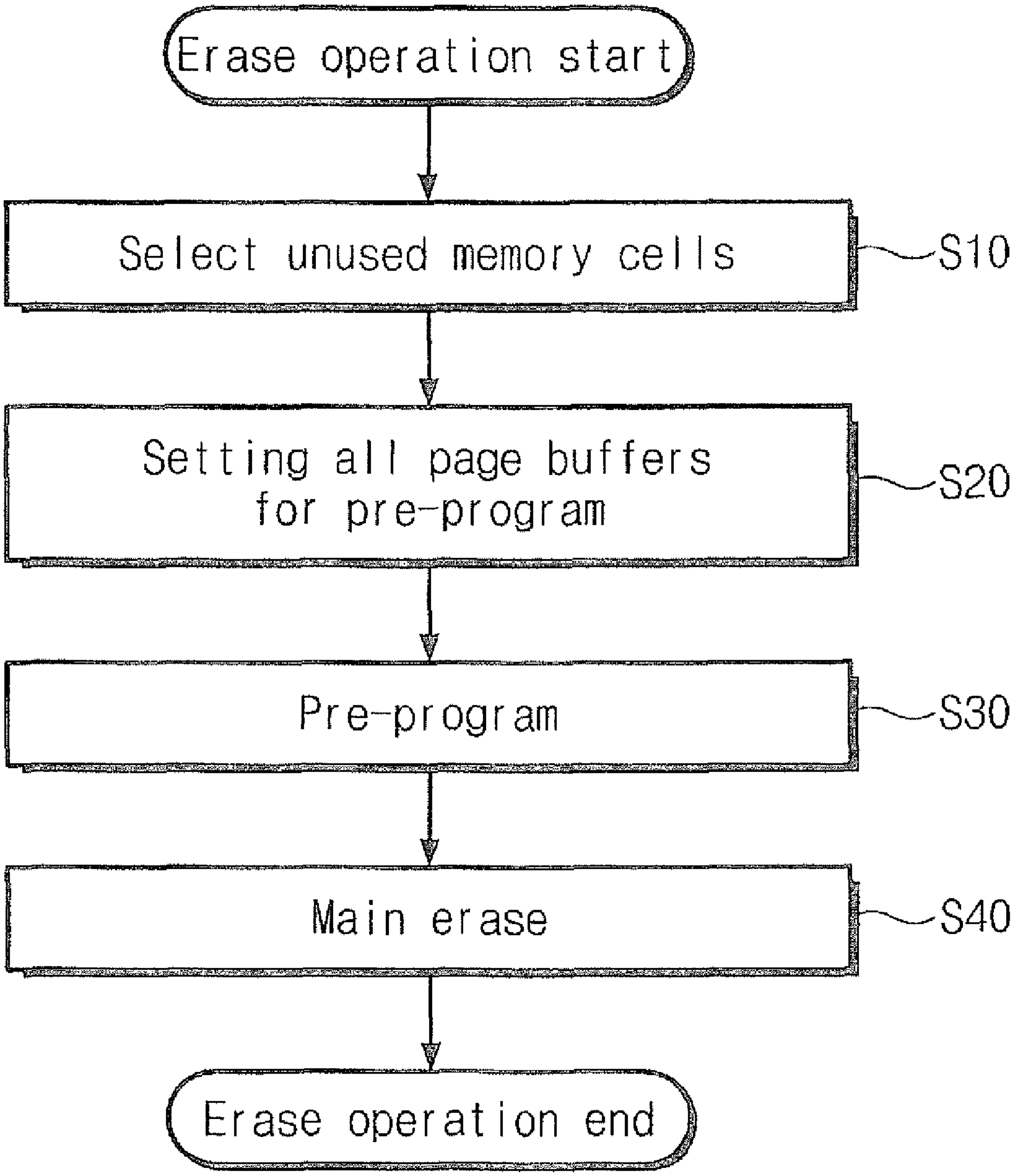
FIG. 3 is a flow chart illustrating operations of pre-programming according to embodiments of the present invention.

FIG. 3 is a flow chart of a pre-programming process according to first embodiments of the present invention. All memory cells including the unused memory cells may be pre-programmed before the block erasing operation.

If an erasure command is input into the flash memory device 100, the erasing operation including the pre-programming procedure may begin under control of the control logic circuit 170. For the pre-programming, the control logic circuit 170 may receive addresses of the unused memory cells from the unused address reservoir 160. If a memory block to be erased includes unused memory cells, the control logic circuit 170 may select the unused memory cells that are included in the block to be erased. During a programming or reading operation, the page buffer circuits corresponding to the unused memory cells may be rendered to be inactive. But if there is an input of the erasure command, the unused memory cells may be selected before a main erasing operation by which the memory block is erased (S10). Afterward, the procedural operations are conducted to pre-program the selected unused memory cells. First, the control logic circuit 170 operatively sets the page buffer circuits corresponding to the unused memory cells. In the operation S10, the control logic circuit 170 sets a pre-programming condition to the page buffer circuits corresponding to the unused memory cells. For example, a data loading is carried out to deliver specific program data to the page buffer circuits corresponding to the unused memory cells. The control logic circuit 170 is able to set bit line voltages, which are output from the page buffer circuits corresponding to the unused memory cells, on a level that is applied thereto in the programming operation. The selected page buffer circuits can be set to program only the unused memory cells into a specific threshold-voltage state. But the unused memory cells can be also pre-programmed together with all memory cells of the memory block to be erased (S20). After setting the page buffer circuits, the pre-programming process is initiated. The pre-programming process can be executed in the unit of a page. Pluralities of pages belonging to the memory block may be programmed in sequence. While there are not shown detailed operations of the pre-programming process, the pre-programming process may be arranged in sequence so that loops of programming and program-verifying are repeated until verified as a pass state. Pre-programming is not due to program the memory cells densely in a specific threshold-voltage distribution. Thus, pre-programming may be conducted even in a programming mode that operates by programming pulses without a verifying operation (S30). After completing the pre-programming process, the main erasing operation may be carried out for the selected memory cell (S40).

As shown in the flow chart of FIG. 3, unused memory cells may always be treated using the pre-programming process every erasing cycle. Therefore, according to erasing methods of first embodiments of the present invention, erasure stress, which causes excessive hole injection into charge trap layers of unused memory cells may be reduced even though unused memory cells are exposed to repetitive erasing cycles.

Figure 4:
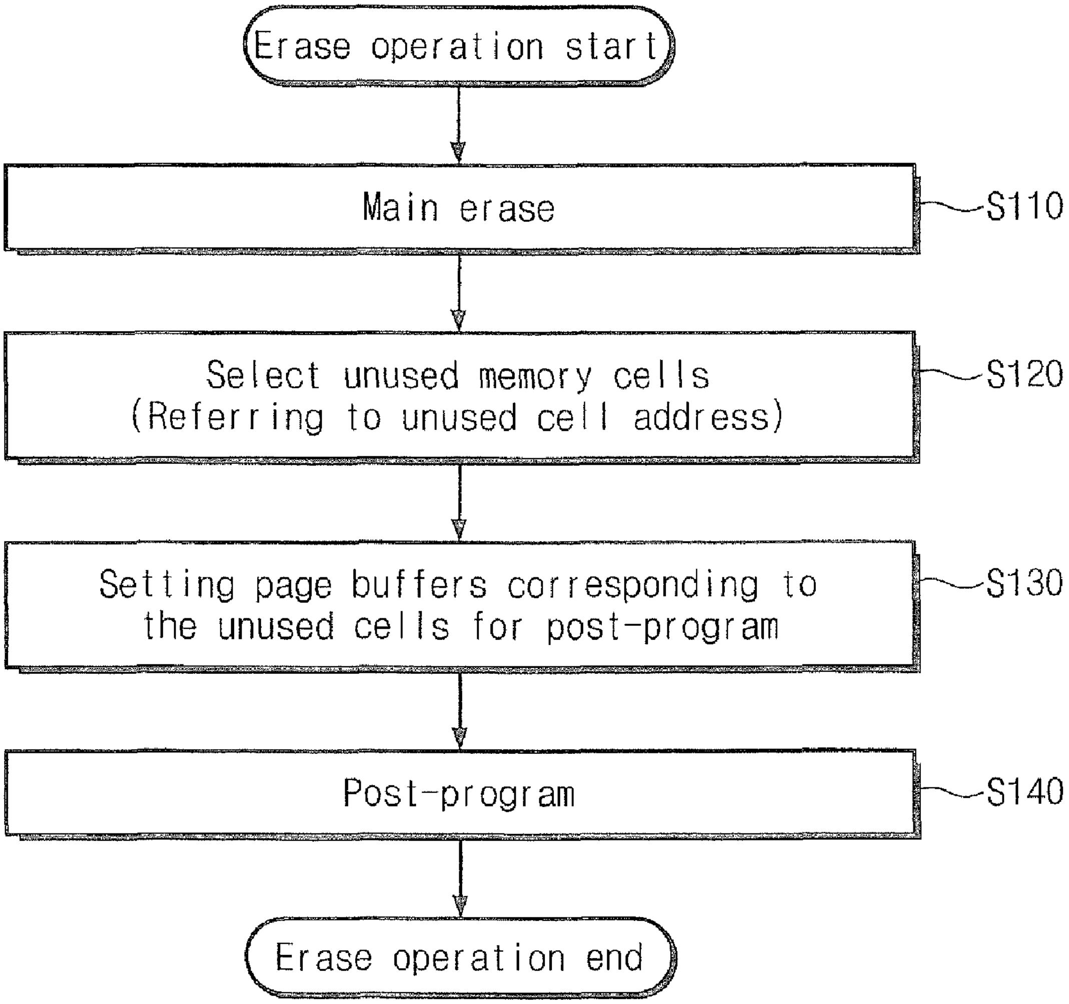
FIG. 4 is a flow chart illustrating operations of post-programming according to embodiments of the present invention.

FIG. 4 is a flow chart of a post-programming process according to second embodiments of the present invention. The second embodiments also illustrate a mode of the erasing operation similar to the first embodiment. Referring to FIG. 4, the second embodiments are also helpful to resolve the trouble of erasure stress by selectively programming the unused memory cells after the block erasing operation.

If an erasure command is input, an erasing operation begins. First, the main erasing operation may be carried out to erase a selected memory block (S110). After completing the block erasure, the unused memory cells may be selected with reference to addresses provided from the unused address reservoir 160 (S120). While the first embodiments are described as simultaneously programming the unused and normal memory cells, the second embodiments are conducted to program only the unused memory cells. Thus, only the page buffer circuits are set in correspondence with the unused memory cells. In operation, the control logic circuit 170 sets the page buffer circuits corresponding to the unused memory cells in accordance with the post-programming condition. For instance, the control logic circuit 170 may control a voltage of the bit lines, which are connected to the page buffer circuits corresponding to the unused memory cells, to be output in a voltage level of the programming operation. Additionally, the control logic circuit 170 may operate to load program data into the page buffer circuits in correspondence with the unused memory cells (S130). After setting the page buffer circuits for the unused memory cells, the post-programming process begins. The post-programming process may be carried out with respect to all the unused memory cells belonging to the memory block to be erased. Thus, if the memory block has a redundant column disused for repair, the post-programming process will be carried out at times corresponding to the number of pages included in the memory block (S140).

Here, the post-programming process may be executed through the same loops with the pre-programming process. That is, the post-programming process can be carried out by way of the programming and program-verifying loops until verified as a pass state. The post-programming is not used to program the memory cells densely in a specific threshold-voltage distribution. Thus, the post-programming may be conducted even in a programming mode that operates by programming pulses without a verifying operation.

The first and second embodiments may be equally applicable to the erasing operation, but the first embodiments may be applicable to the unused memory cells before the block erasing operation, while the second embodiments may be operable after the block erasing operation.

Figure 5:
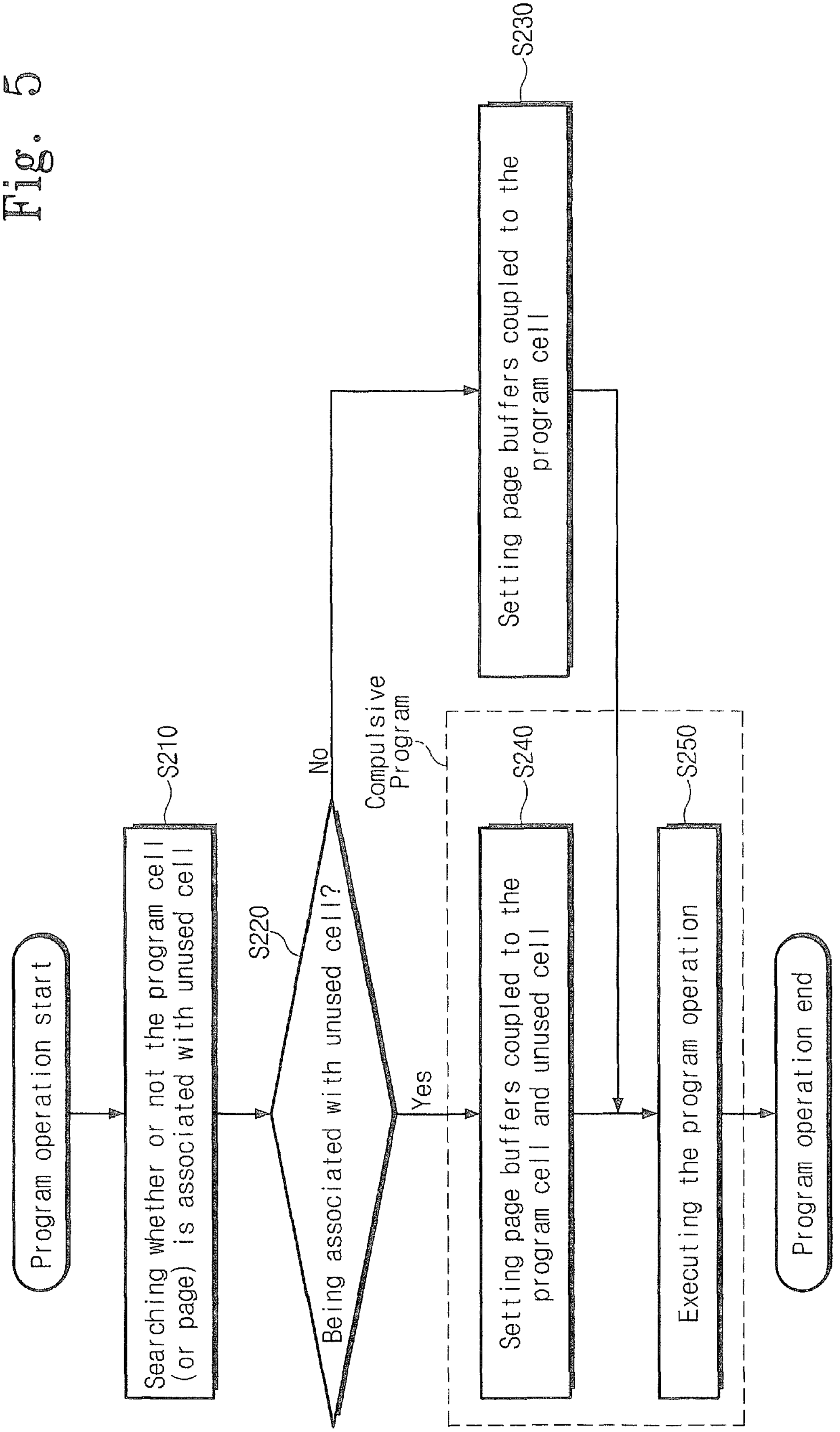
FIG. 5 is a flow chart illustrating operations of compulsive programming according to embodiments of the present invention.

FIG. 5 is a flow chart of a compulsive programming process according to third embodiments of the present invention. This compulsive programming process of the third embodiments provides programming memory cells in response to a program command, different from the first and second embodiments. If an address input during the programming operation is associated with the unused memory cell, it may be set to coincidently program the unused memory cells with memory cells corresponding to the program address.

If a program command (for page programming or multi-page programming) is input from an external source (e.g., a memory controller), the programming operation begins. A program command set is accomplished by accepting an address to be programmed, after receiving a setup command (e.g., '80h'). Then, the flash memory device 100 latches the address subsequent to the setup command. After accepting the address to be programmed, data to be programmed into memory cells are input in correspondence with the address. During this, the control logic circuit 170 finds and compares the latched program address PGM_ADD with an unused memory cell address provided from the unused address reservoir 160 (S210). Through searching or comparing the addresses, control logic circuit 170 determines whether there are unused memory cells involved in a memory unit (e.g., page) to be programmed. If a row address of unused memory cells is identical to the program address PGM_ADD in row, the control logic circuit 170 operates to turn the procedure to the compulsive programming process to program the unused memory cells. Otherwise, if the program address PGM_ADD does not match with unused memory cell addresses, the control logic circuit 170 turns the procedure to an operation for programming only memory cells selected by the program address PGM_ADD (S220).

If the program address PGM_ADD is not involved in the unused memory cell address, the control logic circuit 170 operates to load program data into the page buffer circuits corresponding to the memory cells designated by the program address PGM_ADD (S230). Thereafter, the loaded data are stored in the selected memory cells through the programming loops for which the program voltage is applied to their corresponding word line (S250).

If the program address PGM_ADD is identical to the unused memory cell address, the control logic circuit 170 operates to load program data into the page buffer circuits corresponding to the memory cells designated by the program address PGM_ADD and at the same time sets the page buffer circuits to compulsively program the unused memory cells included in the same row with the program address PGM_ADD. For instance, data '0' can be loaded into the page buffer circuits in correspondence with the unused memory cells. Alternatively, the bit lines can be set to program the unused memory cells, while applying the program voltage to the word line, without data loading. For this bit line set function, a page buffer structure may be prepared that is capable of providing the ground voltage (0V) as a bit line voltage without data loading (S240). After setting the page buffer circuits corresponding to the selected memory cells and the unused memory cells involved in the selected memory cells using the program address PGM_ADD, the programming loops begin (S250). While the comparing and searching operations for programming are carried out on a row address, embodiments of the present invention may not be restricted hereto. The relativity between the program address and the unused memory cell address can be defined with reference to a column address as well as a row address.

As stated, third embodiments are described such that the unused memory cells arranged on the same page or row selected in the programming operation are compulsively programmed in response to the program command. Since the unused memory cells are programmed at the same time with their adjacent memory cells every cycle of the programming operation, electrons are injected into the charge trap layers of the unused memory cells periodically. Therefore, erasure stress arising from the repetitive erasing cycles may be reduced for unused memory cells.

Figure 6:
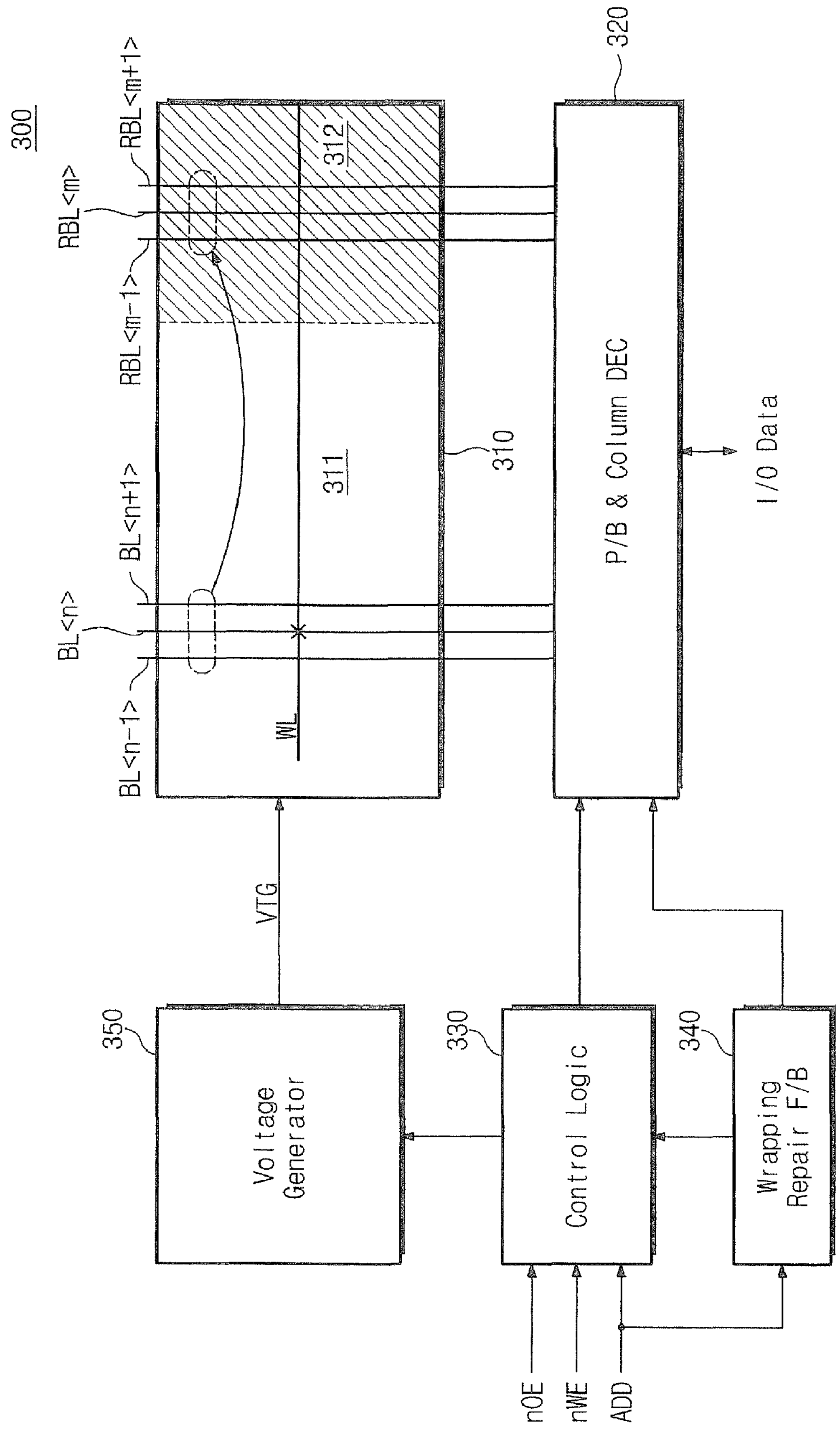
FIG. 6 is a block diagram illustrating charge-trap flash memory devices providing wrapping-repair functions according to embodiments of the present invention.

FIG. 6 is a block diagram of a charge-trap flash memory device 300 operable in a wrapping-repair function according to fourth embodiments of the present invention. As aforementioned, the first through third embodiments may not be concerned with fail columns (or defective columns) in detail. Fail columns may include particles generated from bit lines and defects of the page buffer. Such a fail column may generally be repaired by replacing it with a redundant column. If a column is found to be a failed column, a fuse set operation may be carried out to identify and repair the fail column using a redundant column. The fail column may be replaced with one of the redundant columns by way of the fuse set operation. After repairing the fail column, read/write access to the fail column may be blocked. However, the fail column and memory cells included in the fail column may be exposed to repetitive erasing cycles during block erasing operations. Erasure stress of the fail column may affect the charge trap layers of memory cells included in adjacent normal columns. The flash memory device 300 shown in FIG. 6 is configured to reduce instability of the memory cells adjacent to the fail column, which will be discussed in greater detail as follows.

A cell array 310 includes pluralities of cell transistors having charge trap layers. More particularly, the cell array 310 may include a main field 311 to store program data and a redundant field 312 to replace fail columns of the main field 311 in a column repair method according to embodiments of the present invention. In addition, normal columns adjacent opposite sides of (e.g., to the left and right of) a fail column are replaced with redundant columns. As illustrated in FIG. 6, a bit line BL<n> corresponding to the fail column is repaired using a redundant bit line RBL<n>. Thus, normal bit lines BL<n−1> and BL<n+1> adjacent opposite sides of the fail bit line BL<n> are replaced with redundant bit lines RBL<m−1> and RBL<m+1>. Here, the bit lines BL<n−1> and BL<n+1> adjacent opposite sides of the fail bit line BL<n> are referred to as 'wrapping bit lines' of the fail bit line BL<n>. The redundant bit lines RBL<m−1> and RBL<m+1> used to replace the wrapping bit lines may not always be adjacent to the redundant bit line RBL<m>. The bit lines adjacent to the fail bit line should be replaced with the redundant bit lines even though they are normal bit lines without failures. Such a repair method will be referred to as 'wrapping-repair' hereinafter. This wrapping-repair mode may use a fuse box to enable the fail and wrapping bit lines to be repaired by and/or replaced with the redundant bit lines. The flash memory device 300 may include a wrapping-repair fuse box 340 used to support the wrapping-repair mode.

A page buffer and column decoder 320 may be configured to conduct a wrapping-repair operation in response to control by a control logic circuit 330 and a control signal provided from the wrapping-repair fuse box 340. In particular, during a wrapping-repair operation, the page buffer and column decoder 320 may drive page buffer circuits corresponding to the wrapping bit lines BL<n−1> and BL<n+1>. In other words, the page buffer and column decoder 320 may activate the wrapping bit lines BL<n−1> and BL<n+1> in the same condition with the redundant bit lines RBL<m−1> and RBL<m+1>. For example, a drive voltage for the reading/writing operation with the page buffer circuit corresponding to the wrapping bit line BL<n+1> may be the same as that for the redundant bit line RBL<m+1>. But the page buffer and column decoder 320 may select and output data corresponding to the redundant bit lines RBL<m−1>, RBL<m>, and RBL<m+1> as effective data. As with the case with the wrapping bit lines RBL<m−1> and RBL<m+1>, even the fail bit line BL<n> can be driven at the same time as the redundant bit line RBL<m>.

In operation, data delivered to the page buffer circuits during a programming operation may also be loaded into the wrapping bit lines BL<n−1> and BL<n+1>. After loading data, the wrapping bit line BL<n−1> and the redundant bit line RBL<m−1> may be set up to the same bit-line voltage corresponding to the loaded data. The wrapping bit line BL<n+1> and the redundant bit line RBL<m+1> may also be set up to the same bit-line voltage. Then, if the program voltage is applied to the word line, the programming operation is accomplished. In summary, the wrapping bit lines to be repaired and the redundant bit lines used for repair are set up and precharged in the same voltage. As a result, an effect of erasure stress with respect to the memory cells included in the fail bit line BL<n> may be interrupted by the wrapping bit lines adjacent thereto. And, since the fail and wrapping bit lines are replaced with the redundant bit lines, data reliability of the flash memory device 300 may be improved.

A control logic circuit 330 may operate to control the page buffer and column decoder 320 in response to a command and address provided from an external source (e.g., a memory controller). The control logic circuit 330 may also control a voltage generator 350 to generate a high voltage in correspondence with the command and address. More particularly, the control logic circuit 330 according to embodiments of the present invention may control the page buffer and column decoder 320 to drive the wrapping bit lines and the redundant bit lines used to replace the wrapping bit lines.

The wrapping-repair fuse box 340 may conduct the wrapping-repair operation with reference to an address ADD provided from an external source (e.g., a memory controller). For instance, the wrapping-repair fuse box 340 may enable the wrapping-repair operation to repair (or replace) the wrapping bit lines BL<n−1> and BL<n+1>, which are adjacent to the fail bit line BL<n>, with the redundant bit lines RBL<m−1> and RBL<m+1>. The wrapping-repair fuse box 340 may be provided in addition to a generic fuse box used to replace the fail bit line BL<n> with the redundant bit line RBL<m>. Otherwise, the wrapping-repair fuse box 340 may be substantially implemented by programming a fuse box to repair the wrapping bit lines with the redundant bit lines.

The voltage generator 350 operates to generate word line voltages and bulk voltages for the programming, reading, and erasing operations under control of the control logic circuit 330.

According to fourth embodiments illustrated in FIG. 6, the operation of repairing columns adjacent to the fail column may contribute to compensating for an effect of erasure stress arising from repetitive erasing cycles of the memory cells corresponding to the fail column. Although fourth embodiments shown in FIG. 6 are described as conducted with respect to a fail column, embodiments of the present invention may also be applicable to repairing row fails as well as column fails.

Figure 7:
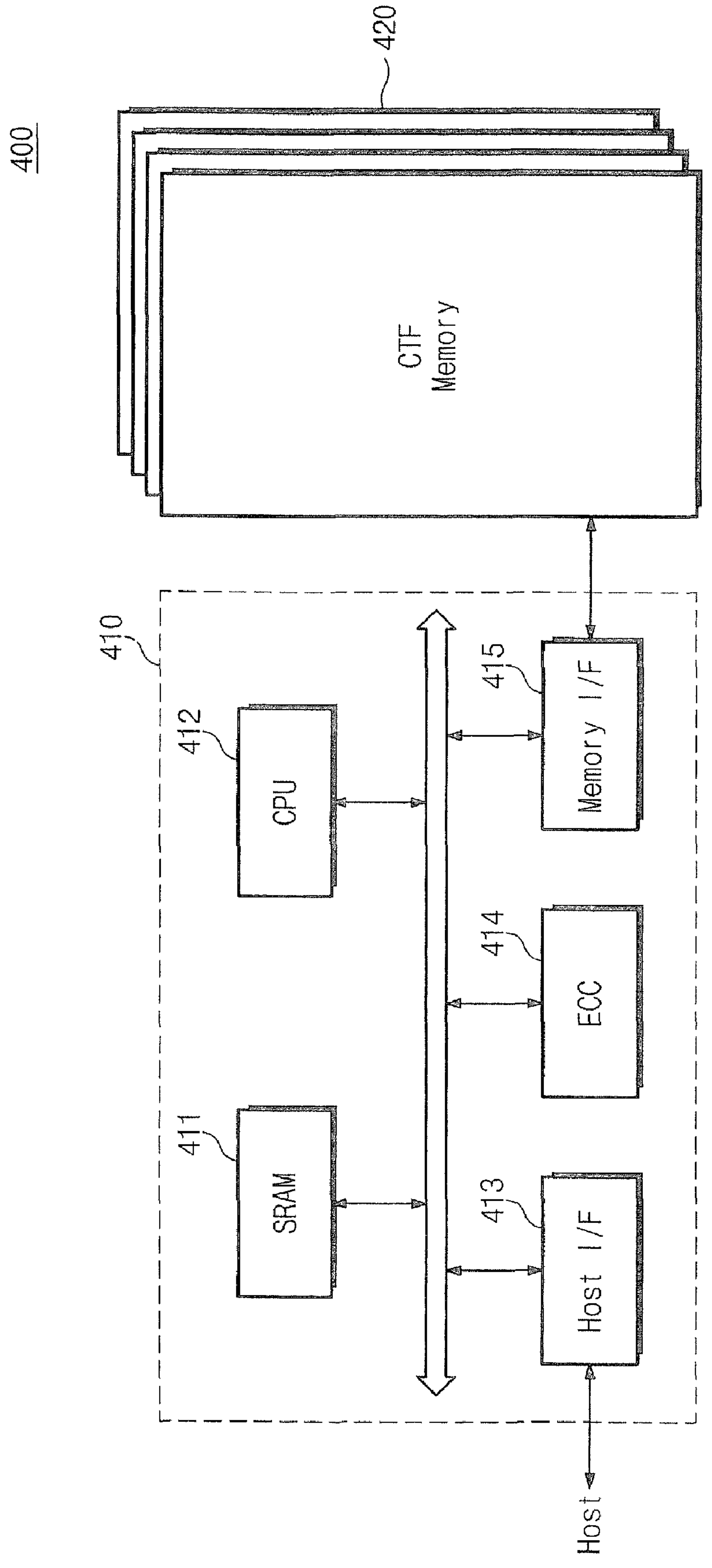
FIG. 7 is a block diagram memory systems with charge-trap flash memory devices according to embodiments of the present invention.

FIG. 7 is a block diagram of a memory system 400 with a charge-trap flash (CTF) memory device 420 like that shown in FIG. 1. Referring to FIG. 7, the memory system 400 according to embodiments of the present invention may include the charge-trap flash memory device 420 and a memory controller 410. The charge-trap flash memory device 420 may be substantially the same as that shown in FIG. 1, so that it will not be described in further detail with respect to FIG. 7. The memory controller 410 may be configured to control the charge-trap flash memory device 420. The charge-trap flash memory device 420 and the memory controller 410 may be provided as respective integrated circuit devices on a same memory card.

A static random access memory (SRAM) 411 may be used as an operation memory for a central processing unit (CPU) 412. A host interface 413 may be equipped with a data exchange protocol of a host connected to the memory system 400. An error check/correction (ECC) block 414 operates to detect and correct an error from data read out of the charge-trap flash memory device 420. A memory interface 415 operates to interface data with the charge-trap flash memory device 420. The CPU 412 conducts an overall control operation to exchange data with the memory controller 410.

Although not shown in FIG. 7, the memory system 400 may further include a read-only memory (ROM) to store code data for interface with the host. The charge-trap flash memory device 420 may be formed in plurality or in the form of multi-chip package with plural members.

Memory systems and/or cards according to embodiments of the present invention may be able to maintain data stability by interrupting erasure stress from unused memory cells of the charge-trap flash memory device 420. Therefore, embodiments of the present invention may provide memory systems 400 with improved reliability. Especially, the charge-trap flash memory device 420 may be used in an advanced memory system such as solid state disk (SSD). In this case, the memory controller 410 may be configured to communicate with an external component (e.g., a host) through one of various protocols such as Universal Serial Bus (USB), MultiMedia Card Peripheral Circuit Interface Express (MMC PCI-E), Advanced Technology Attachment (ATA), serial-ATA, parallel-ATA, Small Computer System Interface (SCSI), Enhanced Small Disk Interface (ESDI), and/or Integrated Drive Electronics (IDE).

The charge-trap flash memory device is a type of nonvolatile memory capable of maintaining data stored therein even without a power supply. With an increase of use with mobile apparatuses such as cellular phones, personal digital assistants (PDA), digital cameras, portable gaming consoles, and MP3 players, flash memory devices are widely used as code storage that needs to retain data regardless of power supply, as well as data storage. Flash memory devices may also be used in home applications such as high-definition TVs, digital versatile disks (DVDs), routers, and global positioning systems (GPSs).

Figure 8:
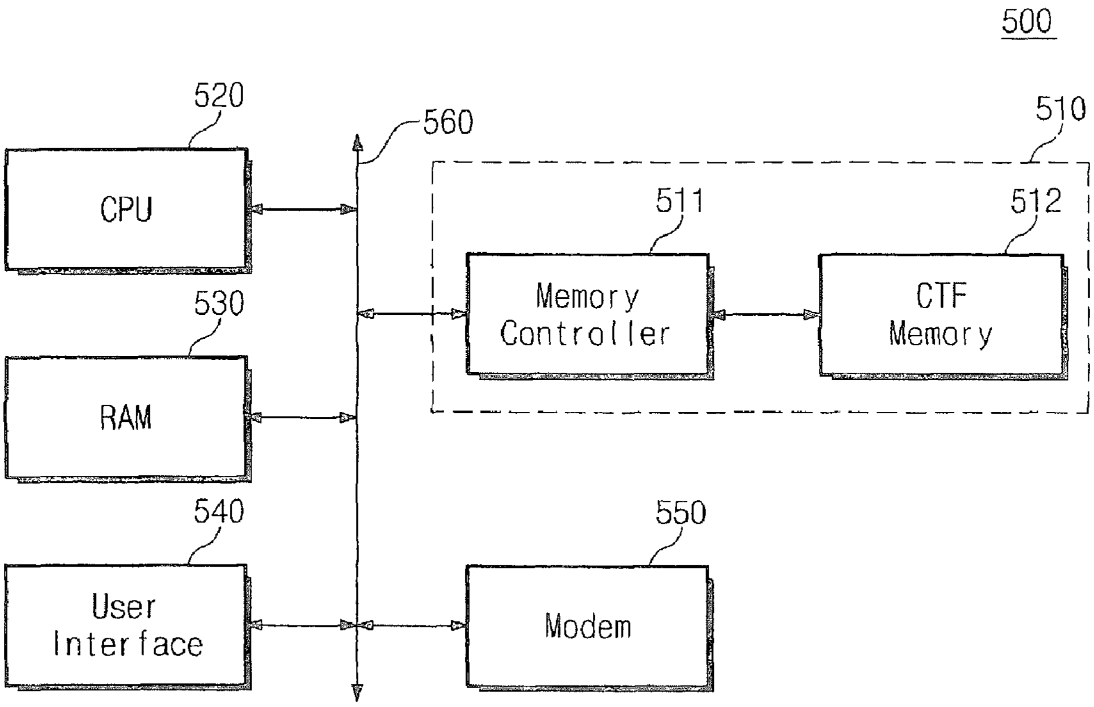
FIG. 8 is a block diagram of computing systems with charge-trap flash memory devices according to embodiments of the present invention.

FIG. 8 is a block diagram of a computing system 500 with a charge-trap flash memory device 512 according to embodiments of the present invention. Referring to FIG. 8, the computing system 500 according to embodiments of the present invention may include a CPU 520, a RAM 530, a user interface 540, a modem 550 such a baseband chipset, and a memory system 510, all of which are connected to each other by way of a system bus 560. The memory system 510 may include a memory controller 511 and the charge-trap flash (CTF) memory device 512. The charge-trap flash memory device 512 shown in FIG. 8 may be configured substantially the same as that shown in FIG. 1. In the charge-trap flash memory device 512, N-bit data (N is a positive integer) processed or to be processed by the CPU 520 are stored through the memory controller 511. If the computing system 500 shown in FIG. 8 is a kind of mobile apparatus, it may further include a battery (not shown) to supply power thereto. Although not shown in FIG. 8, the computing system 2000 may be further equipped with an application chipset, a camera image processor (e.g., complementary metal-oxide-semiconductor (CMOS) image sensor; i.e., CIS), a mobile DRAM, etc. For instance, the memory controller 511 and the charge-trap flash memory device 512 may form a nonvolatile SSD.

The charge-trap flash memory and/or the memory controller can be mounted on the computing system by means of various types of packages. For instance, the charge-trap flash memory and/or memory controller according to embodiments of the present invention may be provided in the computing system using any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack_Package (WSP), or Wafer-level Processed Package (WSP).

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of operating a charge-trap flash memory device including a memory cell array with a plurality of unused memory cells that are unused for data storage and a plurality of normal memory cells that are used for data storage, the method comprising:

selecting one of the normal memory cells to be pre-programmed;

after selecting one of the normal memory cells to be pre-programmed, selecting one of the unused memory cells wherein the plurality of unused memory cells comprise a plurality of dummy or redundant memory cells, and wherein selecting one of the unused memory cells comprises selecting one of the unused memory cells sharing a word line with the selected normal memory cell; and programming the selected unused memory cell to have a programmed threshold voltage that is different than an erased threshold voltage wherein programming the unused memory cell comprises simultaneously pre-programming the selected unused memory cell and the selected normal memory cell to have the programmed threshold voltage that is different than the erased threshold voltage.

2. A method according to claim 1 wherein the memory cell array is arranged into a plurality of blocks wherein each block includes respective unused and normal memory cells, the method further comprising:

after simultaneously pre-programming the selected unused and normal memory cells, erasing a block of the memory cell array including the selected unused and normal memory cells so that the selected unused and normal memory cells have the erased threshold voltage.

3. A method according to claim 2 wherein simultaneously pre-programming the selected unused and normal memory cells comprises setting up a page buffer to simultaneously pre-program the selected unused and normal memory cells.

4. A method according to claim 1 wherein the charge-trap flash memory device includes an address reservoir that stores addresses of the unused memory cells, and wherein selecting the unused memory cell comprises identifying an address stored in the address reservoir having a same row address as a row address of the selected normal memory cell.

5. A method of operating a charge-trap flash memory device including a memory cell array with a plurality of unused memory cells that are unused for data storage and a plurality of normal memory cells that are used for data storage, wherein the memory cell array is arranged into a plurality of blocks, wherein each block includes respective unused and normal memory cells, and wherein the plurality of unused memory cells comprises a plurality of dummy or redundant memory cells, the method comprising:

erasing a block of the memory cell array including respective unused and normal memory cells so that the unused and normal memory cells of the erased block have the erased threshold voltage;

after erasing the block of the memory cell array, selecting one of the unused memory cells of the block; and programming the selected unused memory cell to have a programmed threshold voltage that is different than an erased threshold voltage;

wherein programming the selected unused memory cell comprises setting up a page buffer to selectively post-program the selected unused memory cell without post-programming any normal memory cells of the block including the selected unused memory cell.

* * * * *